United States Patent
Kam et al.

(10) Patent No.: US 9,825,245 B2
(45) Date of Patent: Nov. 21, 2017

(54) ORGANIC LIGHT EMITTING DIODE AND ORGANIC LIGHT EMITTING DISPLAY DEVICE USING THE SAME

(71) Applicant: LG DISPLAY CO., LTD., Seoul (KR)

(72) Inventors: Youn Seok Kam, Seoul (KR); Chang Wook Han, Seoul (KR); Jae Man Lee, Seoul (KR); Se Ung Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 41 days.

(21) Appl. No.: 14/885,542

(22) Filed: Oct. 16, 2015

(65) Prior Publication Data

US 2016/0149151 A1   May 26, 2016

(30) Foreign Application Priority Data

Nov. 25, 2014   (KR) .................. 10-2014-0165338

(51) Int. Cl.
  *H01L 51/52*   (2006.01)
  *H01L 51/50*   (2006.01)
  *H01L 27/32*   (2006.01)

(52) U.S. Cl.
  CPC .......... *H01L 51/504* (2013.01); *H01L 27/322* (2013.01); *H01L 27/3209* (2013.01); *H01L 27/3244* (2013.01); *H01L 51/5218* (2013.01); *H01L 51/5234* (2013.01); *H01L 51/5265* (2013.01); *H01L 51/5278* (2013.01); *H01L 2251/5376* (2013.01)

(58) Field of Classification Search
  CPC ............... H01L 51/504; H01L 51/5206; H01L 51/5221; H01L 51/5056
  See application file for complete search history.

(56) References Cited

U.S. PATENT DOCUMENTS

| | | | |
|---|---|---|---|
| 2009/0079338 A1* | 3/2009 | Mori | H01L 51/5036 313/504 |
| 2009/0191428 A1* | 7/2009 | Hatwar | H01L 51/0077 428/690 |
| 2012/0025180 A1 | 2/2012 | Matsumoto | |
| 2013/0119357 A1 | 5/2013 | Kim et al. | |
| 2013/0320837 A1* | 12/2013 | Weaver | H05B 33/14 313/504 |

(Continued)

FOREIGN PATENT DOCUMENTS

| | | |
|---|---|---|
| CN | 101960632 A | 1/2011 |
| CN | 102396296 A | 3/2012 |

(Continued)

*Primary Examiner* — Kyoung Lee
*Assistant Examiner* — Christina Sylvia
(74) *Attorney, Agent, or Firm* — Dentons US LLP (57) ABSTRACT

An organic light emitting diode and an organic light emitting display apparatus using the organic light emitting diode are provided. The organic light emitting diode includes a first electrode; a second electrode; and an organic layer between the first electrode and the second electrode to emit white light, and the organic layer is configured to emit white light in which an X-axis coordinate value in a color coordinate system is equal to or greater than 0.29, a Y-axis coordinate value in the color coordinate system is in a range of 0.32 to 0.45, and the Y-axis coordinate value in the color coordinate system is equal to or greater than the X-axis coordinate value in the color coordinate system.

17 Claims, 4 Drawing Sheets

(56) References Cited

U.S. PATENT DOCUMENTS

| | | | |
|---|---|---|---|
| 2014/0084269 A1 | | 3/2014 | Weaver et al. |
| 2014/0183494 A1 | | 7/2014 | Kam et al. |
| 2014/0225075 A1 | * | 8/2014 | Zhan ................ H01L 29/78672 |
| | | | 257/40 |

FOREIGN PATENT DOCUMENTS

| | | |
|---|---|---|
| CN | 103107288 A | 5/2013 |
| CN | 103915570 A | 7/2014 |

* cited by examiner

ORGANIC LIGHT EMITTING DIODE AND ORGANIC LIGHT EMITTING DISPLAY DEVICE USING THE SAME

CROSS-REFERENCE TO RELATED APPLICATIONS

This application claims the benefit of the Korean Patent Application No. 10-2014-0165338 filed on Nov. 25, 2014, which is hereby incorporated by reference for all purposes as if fully set forth herein.

BACKGROUND OF THE INVENTION

Field of the Invention

The present invention relates to an organic light emitting diode. More particularly, the present invention relates to an organic light emitting diode that emits white light.

Discussion of the Related Art

An organic light emitting diode has a structure in which a light-emitting layer is formed between a cathode injecting electrons and an anode injecting holes. The electrons generated from the cathode and the holes generated from the anode are injected into the light-emitting layer, and the injected electrons and holes are combined to generate excitons. The generated excitons transition from an excited state to a ground state to emit light.

Such an organic light emitting diode can be variously applied to an illumination, a thin light source of a liquid crystal display apparatus, a display apparatus, and the like. Particularly, the organic light emitting diode emitting white light can be applied to a full-color display apparatus in combination with a color filter.

The organic light emitting diode emitting white light may include a light-emitting portion emitting blue light and a light-emitting portion emitting yellow-green light. In this case, the blue light and the yellow-green light emitted from the light-emitting portions are combined and white light is finally emitted.

Hereinafter, an organic light emitting diode according to the related art will be described with reference to the drawings.

Figure 1:
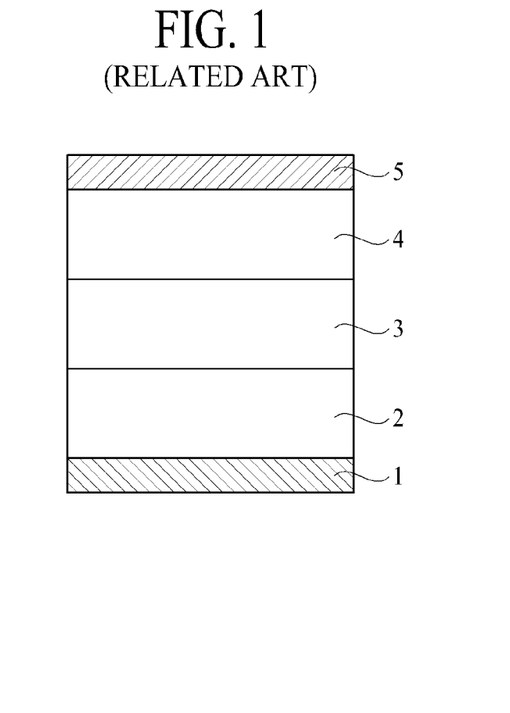
FIG. 1 is a schematic cross-sectional view of an organic light emitting diode according to the related art.

FIG. 1 is a schematic cross-sectional view of an organic light emitting diode according to the related art.

As can be seen from FIG. 1, the organic light emitting diode according to the related art includes a first electrode 1, a first light-emitting portion 2, a second light-emitting portion 3, a third light-emitting portion 4, and a second electrode.

The first electrode 1 may function as an anode.

The first light-emitting portion 2 is formed on the first electrode 1 and is configured to emit blue light. The first light-emitting portion 2 includes a hole transporting layer, an electron transporting layer, and a blue light-emitting layer between the hole transporting layer and the electron transporting layer.

The second light-emitting portion 3 is formed on the first light-emitting portion 2 and is configured to emit yellow-green light. The second light-emitting portion 3 includes a hole transporting layer, an electron transporting layer, and a yellow-green light-emitting layer between the hole transporting layer and the electron transporting layer.

The third light-emitting portion 4 is formed on the second light-emitting portion 3 and is configured to emit blue light. The third light-emitting portion 4 includes a hole transporting layer, an electron transporting layer, and a blue light-emitting layer between the hole transporting layer and the electron transporting layer.

The second electrode 5 is formed on the third light-emitting portion 4 and may function as a cathode.

In the organic light emitting diode according to the related art, blue light emitted from blue light-emitting layers in the first light-emitting portion 2 and the third light-emitting portion 4 and yellow-green light emitted from a yellow-green light-emitting layer in the second light-emitting portion 3 are combined and white light is emitted. In general, the emission efficiency of blue light is lower than the emission efficiency of yellow-green light. Accordingly, two light-emitting portions of the first light-emitting portion 2 and the third light-emitting portion 4 include the blue light-emitting layer.

However, the organic light emitting diode according to the related art has a problem with a color defect in which color coordinates of white light fluctuate depending on individual pixel positions and uniform white light is not emitted from the entire screen. This problem will be more specifically described below with reference to FIG. 2.

Figure 2:
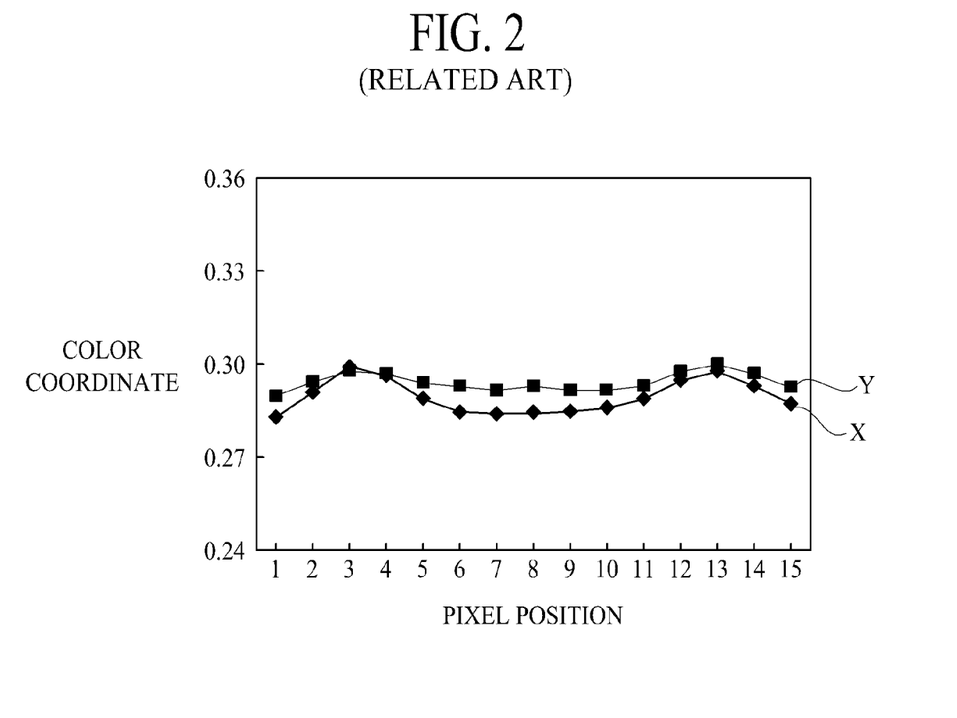
FIG. 2 is a graph illustrating color coordinate values of white light at pixel positions in the organic light emitting diode according to the related art.

FIG. 2 is a graph illustrating color coordinate values of white light by pixel positions in the organic light emitting diode according to the related art.

In FIG. 2, the horizontal axis represents the pixel position and the vertical axis represents the color coordinate value. FIG. 2 illustrates X-axis color coordinate values and Y-axis color coordinate values of white light which are measured at a total of fifteen pixel positions from the left to the right of a screen.

As illustrated in FIG. 2, it can be seen that the X-axis color coordinate value and the Y-axis color coordinate value are not constant but fluctuate depending on the pixel positions. Particularly, at some pixel positions, for example, at the fourth and thirteenth pixel positions, the X-axis color coordinate value is almost equal to the Y-axis color coordinate value. At the third pixel position, the X-axis color coordinate value is greater than the Y-axis color coordinate value. When the X-axis color coordinate value increases in the color coordinate system in this way, the emitted white light becomes reddish. As a result, since reddish white light is emitted from only some pixel positions of the entire screen in the related art, there is a problem in that image quality is lowered.

SUMMARY OF THE INVENTION

The present invention is made to solve the above-mentioned problems and an object thereof is to provide an organic light emitting diode which can improve image quality by solving the problem that reddish white light is emitted from only a specific pixel position and an organic light emitting display apparatus including the organic light emitting diode.

In order to achieve the above-mentioned object, an aspect of the present invention provides an organic light emitting diode including: a first electrode; a second electrode; and an organic layer between the first electrode and the second electrode to emit white light, wherein the organic layer is configured to emit white light in which an X-axis coordinate value in a color coordinate system is equal to or greater than 0.29, a Y-axis coordinate value in the color coordinate system is in a range of 0.32 to 0.45, and the Y-axis coordinate value in the color coordinate system is equal to or greater than the X-axis coordinate value in the color coordinate system.

The organic layer may be configured to emit white light in which the Y-axis coordinate value in the color coordinate system is greater by 0.03 or more than the X-axis coordinate value in the color coordinate system.

A range of fluctuation of the X-axis coordinate value at each pixel position and a range of fluctuation of the Y-axis coordinate value at each pixel position may be equal to or less than 0.015.

The organic layer may include a first light-emitting portion on the first electrode to emit blue light, a second light-emitting portion on the first light-emitting portion to emit yellow-green light or mixed light of green and red, and a third light-emitting portion on the second light-emitting portion to emit blue light.

The second light-emitting portion may include a lower light-emitting layer and an upper light-emitting layer and a first distance from the top surface of the first electrode to an interface between the lower light-emitting layer and the upper light-emitting layer may be equal to or less than a second distance from the bottom surface of the second electrode to the interface between the lower light-emitting layer and the upper light-emitting layer.

A ratio of the second distance to the first distance may be in a range of 1.0 to 1.3.

The lower light-emitting layer and the upper light-emitting layer may be configured to emit yellow-green light and a concentration of a dopant with which the lower light-emitting layer is doped may be greater than a concentration of a dopant with which the upper light-emitting layer is doped.

The lower light-emitting layer may be configured to emit red light and the upper light-emitting layer may be configured to emit green light.

The first electrode may be a transflective electrode and the second electrode may be a reflective electrode.

Another aspect of the present invention provides an organic light emitting display apparatus including: a substrate; a thin-film transistor layer on the substrate; an organic light emitting diode on the thin-film transistor layer to emit white light; an encapsulation layer on the organic light emitting diode; and a color filter layer transmitting light of a specific wavelength among the white light emitted from the organic light emitting diode, wherein the organic light emitting diode includes a first electrode, a second electrode, and an organic layer between the first electrode and the second electrode to emit white light and wherein the organic layer is configured to emit white light in which an X-axis coordinate value in a color coordinate system is equal to or greater than 0.29, a Y-axis coordinate value in the color coordinate system is in a range of 0.32 to 0.45, and the Y-axis coordinate value in the color coordinate system is equal to or greater than the X-axis coordinate value in the color coordinate system.

The organic layer may be configured to emit white light in which the Y-axis coordinate value in the color coordinate system is greater by 0.03 or more than the X-axis coordinate value in the color coordinate system.

A range of fluctuation of the X-axis coordinate value at each pixel position and a range of fluctuation of the Y-axis coordinate value at each pixel position may be equal to or less than 0.015.

The organic layer may include a first light-emitting portion on the first electrode to emit blue light, a second light-emitting portion on the first light-emitting portion to emit yellow-green light or mixed light of green and red, and a third light-emitting portion on the second light-emitting portion to emit blue light.

The second light-emitting portion may include a lower light-emitting layer and an upper light-emitting layer and a first distance from the top surface of the first electrode to an interface between the lower light-emitting layer and the upper light-emitting layer may be equal to or less than a second distance from the bottom surface of the second electrode to the interface between the lower light-emitting layer and the upper light-emitting layer.

A ratio of the second distance to the first distance may be in a range of 1.0 to 1.3.

Another aspect of the present invention provides an organic light-emitting display apparatus including: a first electrode; a second electrode; a first light-emitting portion on the first electrode, the first light-emitting portion including a first light-emitting layer; a second light-emitting portion on the first light-emitting portion, the second light-emitting portion including a second light-emitting layer; and a third light-emitting portion on the second light-emitting portion, the third light-emitting portion including a third light-emitting layer, wherein the second light-emitting layer includes a first area and a second area, and a first distance from the top surface of the first electrode to the first area is equal to or less than a second distance from the bottom surface of the second electrode to the second area.

A ratio of the second distance to the first distance may be in a range of 1.0 to 1.3.

The second light-emitting layer may be configured to emit yellow-green light and a concentration of a dopant with which the first area is doped may be greater than a concentration of a dopant with which the second area is doped so as to enhance red efficiency.

White light in which an X-axis coordinate value in a color coordinate system is equal to or greater than 0.29, a Y-axis coordinate value in the color coordinate system is in a range of 0.32 to 0.45, and the Y-axis coordinate value in the color coordinate system is equal to or greater than the X-axis coordinate value in the color coordinate system may be emitted so as to reduce a color defect of the organic light emitting display apparatus.

A range of fluctuation of the X-axis coordinate value at each pixel position and a range of fluctuation of the Y-axis coordinate value at each pixel position may be equal to or less than 0.015 so as to minimize a color coordinate difference of the white light at each pixel position of the organic light-emitting display apparatus.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Advantages and features of the invention and methods for achieving the advantages or features will be apparent from embodiments described below in detail with reference to the accompanying drawings. However, the invention is not limited to the embodiments but can be modified in various forms. The embodiments are provided merely for completing the disclosure of the invention and are provided for completely informing those skilled in the art of the scope of the invention. The scope of the invention is defined by only the appended claims.

Shapes, sizes, ratios, angles, number of pieces, and the like illustrated in the drawings, which are provided for the purpose of explaining the embodiments of the invention, are exemplary and thus the invention is not limited to the illustrated details. In the following description, like elements are referenced by like reference numerals. When it is determined that detailed description of the relevant known functions or configurations involved in the invention makes the gist of the invention obscure, the detailed description thereof will not be made. When "include," "have", "be constituted", and the like are mentioned in the specification, another element may be added unless "only" is used. A singular expression of an element includes two or more elements unless differently mentioned.

In construing elements, an error range is included even when explicit description is not made.

For example, when positional relationships between two parts are described using 'on~', 'over~', 'under~', 'next~', and the like, one or more other parts may be disposed between the two parts unless 'just' or 'direct' is used.

For example, when temporal relationships are described using "after", "subsequent to", "next", "before", and the like, such expression may include temporal discontinuity unless "immediately" or "directly" is used.

Terms "first", "second", and the like can be used to describe various elements, but the elements should not be limited to the terms. The terms are used only to distinguish an element from another. Therefore, a first element may be a second element within the technical spirit of the invention.

Features of the embodiments of the invention can be coupled or combined partially or on the whole and can be technically interlinked and driven in various forms. The embodiments may be put into practice independently or in combination.

Hereinafter, embodiments of the invention will be described in detail with reference to the accompanying drawings.

Figure 3:
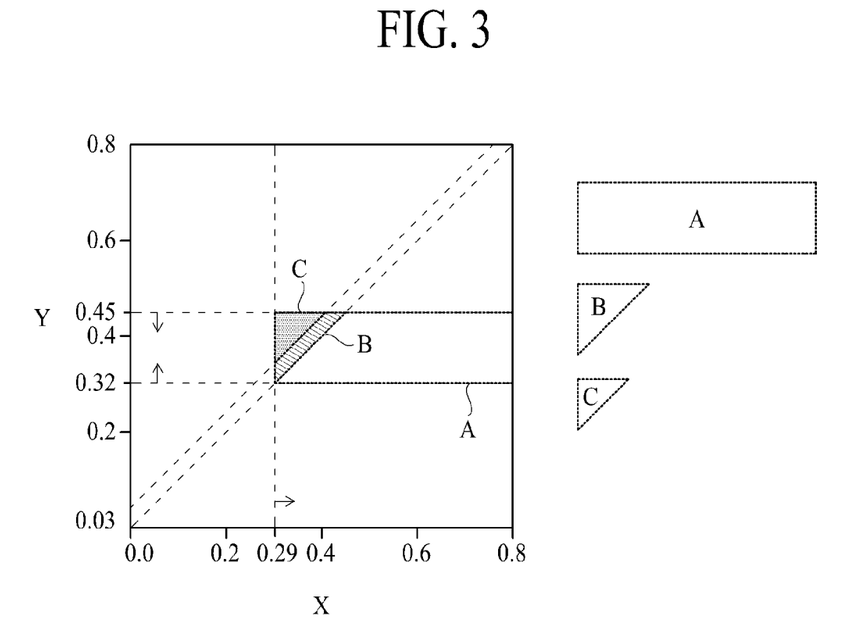
FIG. 3 is a graph illustrating a color coordinate system of an organic light emitting diode according to an embodiment of the present invention.

FIG. 3 is a graph illustrating a color coordinate system of an organic light emitting diode according to an embodiment of the present invention and specifically illustrates a CIE color coordinate system. Color coordinates in the entire specification mean CIE color coordinates.

An organic light emitting diode according to an embodiment of the invention emits white light. Such white light satisfies the following conditions.

First, white light emitted from the organic light emitting diode according to the embodiment of the invention satisfies conditions that an X-axis coordinate value in the color coordinate system is equal to or greater than 0.29 and a Y-axis coordinate value in the color coordinate system is in a range of 0.32 to 0.45.

When the X-axis coordinate value of the emitted light is equal to or greater than 0.29 and the Y-axis coordinate value thereof is in a range of 0.32 to 0.45, light having color coordinate values in the rectangular range (see A) in FIG. 3 is emitted. The light having the color coordinate values in the rectangular range (see A) includes reddish white light to red light. Accordingly, red light should be removed from the rectangular range (see A) so as to acquire white light.

In the white light emitted from the organic light emitting diode according to the embodiment of the invention, the Y-axis coordinate value in the color coordinate system is equal to or greater than the X-axis coordinate value in the color coordinate system. As described above, when the X-axis coordinate value is equal to or greater than 0.29, the Y-axis coordinate value in the color coordinate system is in a range of 0.32 to 0.45, and the Y-axis coordinate value in the color coordinate system is equal to or greater than the X-axis coordinate value in the color coordinate system, light having color coordinate values in a relatively-large triangular range (see B) is emitted in FIG. 3. The light having the color coordinate values in the relatively-large triangular range (see B) corresponds to reddish white light.

As a result, according to the embodiment of the invention, the emitted light corresponds to reddish white light. Therefore, even when the X-axis color coordinate value and the Y-axis color coordinate value at each pixel position are not constant but fluctuate and reddish white light is emitted from a specific pixel position, reddish white light is already emitted from the screen as a whole and thus a user cannot recognize a color defect at the specific pixel position.

In the embodiment of the invention, when the X-axis coordinate value in the color coordinate system is less than 0.29, the emitted light may be bluish and desired reddish white light may not be acquired. When the Y-axis coordinate value in the color coordinate system is less than 0.32 or greater than 0.45, the emitted light may deviate from a color coordinate range of white light. Accordingly, in order to acquire desired white light, it is preferable that the X-axis coordinate value in the color coordinate system may be equal to or greater than 0.29 and the Y-axis coordinate value in the color coordinate system may be in the range of 0.32 to 0.45.

On the other hand, when a concentration of red is high in emitting reddish white light form the entire screen, image quality may be adversely affected and it is thus necessary to appropriately adjust the concentration of red in the white light. Accordingly, in white light emitted from an organic light emitting diode according to another embodiment of the invention, the Y-axis coordinate value in the color coordinate system is greater by 0.03 or more than the X-axis coordinate value.

As described above, when the X-axis coordinate value in the color coordinate system is equal to or greater than 0.29, the Y-axis coordinate value in the color coordinate system is in a range of 0.32 to 0.45, and the Y-axis coordinate value in the color coordinate system is greater by 0.03 or more than the X-axis coordinate value in the color coordinate system, light having color coordinate values in the relatively-small triangular range (see C) in FIG. 3 is emitted. Since the light having the color coordinate values in the relatively-small triangular range (see C) is not higher in the concentration of red than the light having the color coordinate values in the relatively-large triangular range (see B), the image quality can be improved.

Figure 4:
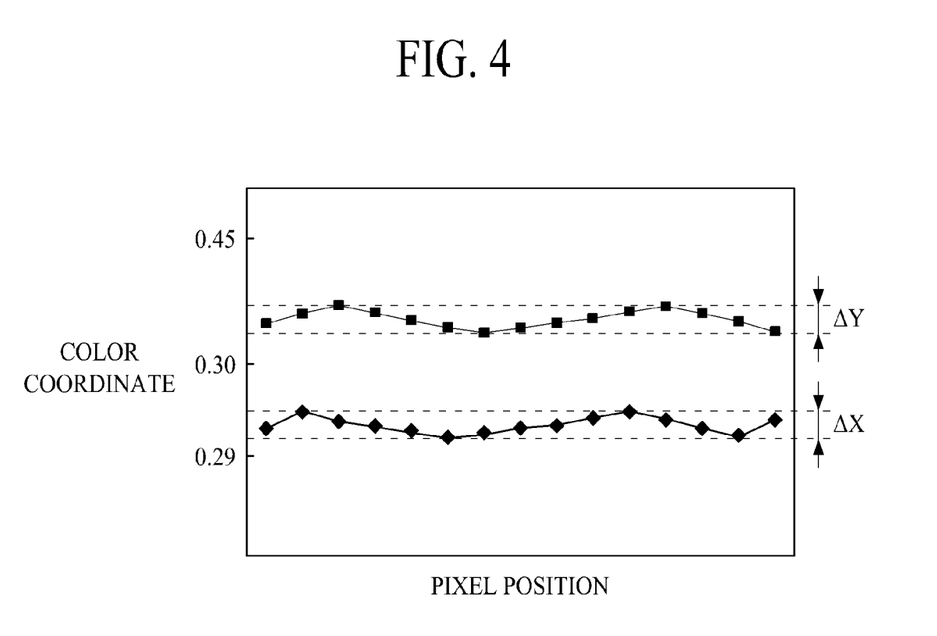
FIG. 4 is a graph illustrating color coordinate values of white light at pixel positions in the organic light emitting diode according to the embodiment of the present invention.

FIG. 4 is a graph illustrating color coordinate values of white light at pixel positions in the organic light emitting diode according to the embodiment of the invention. In FIG. 4, the horizontal axis represents the pixel position and the vertical axis represents the color coordinate value.

As illustrated in FIG. 4, in the white light emitted from the organic light emitting diode according to the embodiment of the invention, the X-axis coordinate value in the color coordinate system is equal to or greater than 0.29, the Y-axis coordinate value in the color coordinate system is in a range of 0.32 to 0.45, and the Y-axis coordinate value in the color coordinate system is equal to or greater than the X-axis coordinate value in the color coordinate system.

On the other hand, the X-axis color coordinate value and the Y-axis color coordinate value at each pixel position are not constant but may fluctuate. At this time, it is preferable that the range of fluctuation ΔX of the X-axis coordinate value of white light at each pixel position be equal to or less than 0.015 and the range of fluctuation ΔY of the Y-axis coordinate value of white light at each pixel position be equal to or less than 0.015. When the range of fluctuation ΔX of the X-axis coordinate value or the range of fluctuation ΔY of the Y-axis coordinate value is greater than 0.015, there is a possibility that the color coordinate difference of white light at each pixel position will increase and the image quality will be lowered.

According to the invention, reddish white light is emitted by adjusting the emitted light such that the X-axis coordinate value in the color coordinate system is equal to or greater than 0.29, the Y-axis coordinate value in the color coordinate system is in a range of 0.32 to 0.45, and the Y-axis coordinate value in the color coordinate system is equal to or greater than the X-axis coordinate value in the color coordinate system or is greater by 0.03 or more the X-axis coordinate value. This can be implemented by adjusting the position of a second light-emitting layer in a second light-emitting portion located in the middle of the organic light emitting diode having plural light-emitting portions as will be described later.

Figure 5:
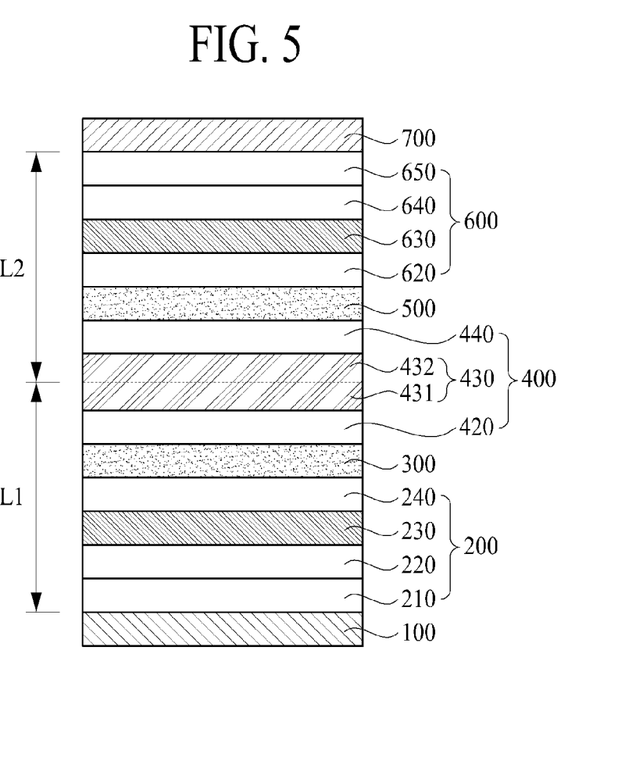
FIG. 5 is a schematic cross-sectional view of the organic light emitting diode according to the embodiment of the present invention.

FIG. 5 is a schematic cross-sectional view of the organic light emitting diode according to the embodiment of the invention.

As illustrated in FIG. 5, the organic light emitting diode according to the embodiment of the invention includes a first electrode 100, a first light-emitting portion 200, a first charge generating layer 300, a second light-emitting portion 400, a second charge generating layer 500, a third light-emitting portion 600, and a second electrode 700.

The first electrode 100 can function as an anode. The first electrode 100 can be formed of a transparent conductive material having a high conductivity and a high work function, such as indium tin oxide (ITO), indium zinc oxide (IZO), SnO2, or ZnO, but is not limited to the material.

The first light-emitting portion 200 is formed on the first electrode 100 and emits blue light. The first light-emitting portion 200 includes a hole injecting layer 210, a first hole transporting layer 220, a first light-emitting layer 230, and a first electron transporting layer 240.

The hole injecting layer 210 is formed on the first electrode 100 and can be formed of MTDATA (4,4',4"-tris(3-methylphenylphenylamino)triphenylamine), CuPc (copper phthalocyanine), PEDOT/PSS (poly(3,4-ethylenedioxythiphene, polystyrene sulfonate), or the like, but is not limited to these materials. For example, the hole injecting layer 210 may be formed by doping a material constituting the first hole transporting layer 220 with a P-type dopant.

The first hole transporting layer 220 is formed on the hole injecting layer 210 and can be formed of TPD (N,N'-diphenyl-N,N'-bis(3-methylphenyl)-1,1'-bi-phenyl-4,4'-diamine), NPD (N,N-dinaphthyl-N,N'-diphenyl benzidine), NPB (N,N'-di(naphthalen-1-yl)-N,N'-diphenyl-benzidine), or the like, but is not limited to these materials. The first hole transporting layer 220 may be formed of the same material as the hole injecting layer 210 except that the first hole transporting layer 220 is not doped with the P-type dopant. In this case, the hole injecting layer 210 and the first hole transporting layer 220 may be formed through a continuous deposition process using the same processing equipment.

The first light-emitting layer 230 is formed on the first hole transporting layer 220. The first light-emitting layer 230 is formed of a blue light-emitting layer emitting blue light.

The first light-emitting layer 230 may include, for example, an organic material capable of emitting blue light of which a peak wavelength ranges from 440 nm to 480 nm. The first light-emitting layer may be formed by doping at least one fluorescent host material among anthracene derivatives, pyrene derivatives, and perylene derivatives with a fluorescent blue dopant, but is not limited to this example.

The first electron transporting layer 240 is formed on the first light-emitting layer 230 and can be formed of oxadiazole, triazole, phenanthroline, benzoxazole, benzthiazole, or the like, but is not limited to these materials.

The first charge generating layer 300 is formed between the first light-emitting portion 200 and the second light-emitting portion 400 and functions to harmoniously adjust charges between the first light-emitting portion 200 and the second light-emitting portion 400. The first charge generating layer 300 includes an n-type charge generating layer formed on the first light-emitting portion 200 and located adjacent to the first light-emitting portion 200 and a p-type charge generating layer formed on the n-type charge generating layer and located adjacent to the second light-emitting portion 400. The n-type charge generating layer injects electrons into the first light-emitting portion 200 and the p-type charge generating layer injects holes into the second light-emitting portion 400. The n-type charge generating layer can be formed of an organic layer doped with an alkali metal such as Li, Na, K, or Cs or an alkali earth metal such as Mg, Sr, Ba, or Ra. The p-type charge generating layer can be formed by doping an organic material having hole transporting capability with a dopant.

The second light-emitting portion 400 is formed on the first charge generating layer 300 and can emit yellow-green light or mixed light of green and red. The second light-emitting portion 400 includes a second hole transporting layer 420, a second light-emitting layer 430, and a second electron transporting layer 440.

The second hole transporting layer 420 is formed on the first charge generating layer 300 and can be formed of TPD(N,N'-diphenyl-N,N'-bis(3-methylphenyl)-1,1'-bi-phenyl-4,4'-diamine), NPD (N,N-dinaphthyl-N,N'-diphenyl benzidine), NPB (N,N'-di(naphthalen-1-yl)-N,N'-diphenyl-benzidine), or the like, but is not limited to these materials. The second hole transporting layer 420 can be formed of the same material as the first hole transporting layer 220, but may be formed of a material different therefrom in some cases.

The second light-emitting layer 430 is formed on the second hole transporting layer 420. The second light-emitting layer 430 includes a lower light-emitting layer 431 and an upper light-emitting layer 432.

Both the lower light-emitting layer 431 and the upper light-emitting layer 432 can be formed of a yellow-green light-emitting layer emitting yellow-green light. In this case, the lower light-emitting layer 431 and the upper light-emitting layer 432 can include an organic material capable of emitting yellow-green light, for example, light of which the peak wavelength ranges from 520 nm to 590 nm, and can be specifically formed by doping a phosphorescent host material including carbazole-based compound or metal complex with a phosphorescent yellow-green dopant. Examples of the carbazole-based compound include CBP (4,4-N,N'-dicarbazole-biphenyl), CBP derivatives, mCP (N,N'-dicarbazolyl-3,5-benzene), and mCP derivatives. Examples of the metal complex include ZnPBO (phenyloxazole) metal complex and ZnPBT (phenylthiazole) metal complex.

When the lower light-emitting layer 431 and the upper light-emitting layer 432 are formed of the yellow-green light-emitting layer, the concentration of the dopant of the lower light-emitting layer 431 is preferably higher than the concentration of the dopant of the upper light-emitting layer 432. According to the embodiment of the invention, by adjusting the concentration of the dopant in the lower light-emitting layer 431 close to the first electrode 100 functioning as an anode to be higher than the concentration of the dopant in the upper light-emitting layer 432 distant from the first electrode 100, it is possible to improve emission efficiency of the light emitted from the lower light-emitting layer 431 having a relatively-high concentration of a dopant, which is advantageous for emission of reddish white light. This will be described later.

On the other hand, according to another embodiment of the invention, the lower light-emitting layer 431 is formed of a red light-emitting layer emitting red light and the upper light-emitting layer 432 is formed of a green light-emitting layer emitting green light. In this case, the lower light-emitting layer 431 can include an organic material capable of emitting red light, for example, light of which the peak wavelength ranges from 600 nm to 650 nm, and can be specifically formed by doping a phosphorescent host material including carbazole-based compound or metal complex with a red dopant such as metal complex of Ir or Pt. The upper light-emitting layer 432 can include an organic material capable of emitting green light, for example, light of which the peak wavelength ranges from 540 nm to 590 nm, and can be specifically formed by doping a phosphorescent host material including carbazole-based compound or metal complex with a green dopant. According to the embodiment of the invention, by forming the lower light-emitting layer 431 close to the first electrode 100 functioning as an anode out of the red light-emitting layer and forming the upper light-emitting layer 432 distant from the first electrode 100 out of the green light-emitting layer, it is possible to improve emission efficiency of the light emitted from the lower light-emitting layer 431 formed of the red light-emitting layer, which is advantageous for emission of reddish white light. This will be described later.

The second electron transporting layer 440 is formed on the second light-emitting layer 430 and can be formed of oxadiazole, triazole, phenanthroline, benzoxazole, benzthiazole, or the like, but is not limited to these materials. The second electron transporting layer 440 can be formed of the same material as the first electron transporting layer 240, but may be formed of a material different therefrom in some cases.

The second charge generating layer 500 is formed between the second light-emitting portion 400 and the third light-emitting portion 600 and functions to harmoniously adjust charges between the second light-emitting portion 400 and the third light-emitting portion 600. The second charge generating layer 500 includes an n-type charge generating layer formed on the second light-emitting portion 400 and located adjacent to the second light-emitting portion 400 and a p-type charge generating layer formed on the n-type charge generating layer and located adjacent to the third light-emitting portion 600. The n-type charge generating layer and the p-type charge generating layer can be formed of the same materials as the first charge generating layer 300.

The third light-emitting portion 600 is formed on the second charge generating layer 500 and can emit blue light. The third light-emitting portion 600 includes a third hole transporting layer 620, a third light-emitting layer 630, a third electron transporting layer 640, and an electron injecting layer 650.

The third hole transporting layer 620 is formed on the second charge generating layer 500 and can be formed of TPD(N,N'-diphenyl-N,N'-bis(3-methylphenyl)-1,1'-biphenyl-4,4'-diamine), NPD (N,N-dinaphthyl-N,N'-diphenyl benzidine), NPB (N,N'-di(naphthalen-1-yl)-N,N'-diphenylbenzidine), or the like, but is not limited to these materials. The third hole transporting layer 620 can be formed of the same material as the first hole transporting layer 220 or the second hole transporting layer 420, but may be formed of a material different therefrom in some cases.

The third light-emitting layer 630 is formed on the third hole transporting layer 620. The third light-emitting layer 630 includes a blue light-emitting layer emitting blue light.

The blue light-emitting layer may include, for example, an organic material capable of emitting blue light, for example, blue light of which the peak wavelength ranges from 440 nm to 480 nm and can be formed specifically by doping at least one fluorescent host material among anthracene derivatives, pyrene derivatives, and perylene derivatives with a fluorescent blue dopant, but is not limited to this example.

The third light-emitting layer 630 can be formed of the same material as the first light-emitting layer 230, but may be formed of a material different therefrom in some cases.

The third electron transporting layer 640 is formed on the third light-emitting layer 630 and can be formed of oxadiazole, triazole, phenanthroline, benzoxazole, benzthiazole, or the like, but is not limited to these materials. The third electron transporting layer 640 can be formed of the same material as the first electron transporting layer 240 or the second electron transporting layer 440, but may be formed of a material different therefrom in some cases.

The electron injecting layer 650 is formed on the third electron transporting layer 640 and can be formed of lithium fluoride (LiF) or lithium quinolate (Liq), but is not limited to these materials.

The second electrode 700 is formed on the third light-emitting portion 600. The second electrode 700 can function as a cathode. The second electrode 700 can be formed of a metal having a low work function, such as aluminum (Al), silver (Ag), magnesium (Mg), lithium (Li), or calcium (Ca), but is not limited to these materials.

According to the above-mentioned embodiment of the invention, the first light-emitting layer 230 in the first light-emitting portion 200 and the third light-emitting layer 630 in the third light-emitting portion 600 emit blue light, and the second light-emitting layer 430 in the second light-emitting portion 400 emits yellow-green light or mixed light of green (G) and red (R), whereby white light can be emitted.

On the other hand, the second electrode 700 can function as a reflective electrode which is opaque to reflect light, and the first electrode 100 can function as a transflective electrode which is translucent to transmit some light and to reflect some light. In this case, it is possible to obtain improvement in emission efficiency due to microcavity occurring between the first electrode 100 and the second electrode 700. The microcavity means that light is repeatedly reflected and re-reflected to cause constructive interference between the first electrode 100 and the second electrode 700 which are separated by an optical path length from each other and the finally-emitted light is amplified to improve the emission efficiency. At this time, in order for light to be repeatedly reflected and re-reflected to cause the constructive interference, a resonance distance for each wavelength of emitted light should be set between the first electrode 100 and the second electrode 700. The resonance distance has to be designed to be an integer multiple of a half wavelength ($\lambda/2$) of the emitted light.

When the resonance distance for light of a specific wavelength is formed in this way, light of the corresponding wavelength among the emitted light is repeatedly reflected between the first electrode 100 and the second electrode 700 and is emitted to the outside in a state in which the amplitude of the light has increased due to the constructive interference. On the other hand, light of other wavelengths is repeatedly reflected between the first electrode 100 and the second electrode 700 and is emitted to the outside in a state in which the amplitude of the light has decreased due to the destructive interference. Accordingly, the emission efficiency for light of the specific wavelength corresponding to the resonance distance may be improved by a microcavity effect Here, the spectrum of the second light-emitting layer 430 moves to a long wavelength range when the second light-emitting layer 430 is separated apart from the second electrode 700, and moves to a short wavelength range when the second light-emitting layer 430 approaches the second electrode 700. This is because the spectrum varies depending on the optical path length when light emitted from the second light-emitting layer 430 is reflected by the second electrode 700 and is emitted to the second electrode 100. Accordingly, in order to improve the emission efficiency using the microcavity, it is preferable that the second light-emitting layer 430 move to a long wavelength range. That is, it is preferable that the second light-emitting layer 430 be formed close to the first electrode 100.

Since the second electrode 700 is a reflective electrode and the first electrode 100 is a transflective electrode, light is emitted through the first electrode 100. Accordingly, in order to acquire desired reddish white light, it is preferable that the second light-emitting layer 430 emitting light of a long wavelength be located at a position closer to the first second electrode 100 than the second electrode 700.

Preferably, a first distance L1 from the top surface of the first electrode 100 to an interface between the lower light-emitting layer 431 and the upper light-emitting layer 432 of the second light-emitting layer 430 is equal to or less than a second distance L2 from the bottom surface of the second electrode 700 to the interface between the lower light-emitting layer 431 and the upper light-emitting layer 432 of the second light-emitting layer 430.

When the first distance L1 is equal to or less than the second distance L2, the lower light-emitting layer 431 of the second light-emitting layer 430 is located closer to the first electrode 100 than the second electrode 700. Accordingly, it is possible to obtain an effect of improvement in the emission efficiency of light emitted from the red light-emitting layer constituting the lower light-emitting layer 431 or the yellow-green light-emitting layer having a relatively-high concentration of a dopant, which is advantageous for emitting reddish white light.

On the other hand, a ratio L2/L1 of the second distance L2 to the first distance L1 is preferably in a range of 1.0 to 1.3. When the ratio L2/L1 of the second distance L2 to the first distance L1 is greater than 1.3, the lower light-emitting layer 431 of the second light-emitting layer 430 may be located excessively close to the first electrode 100 and the effect of improvement in the emission efficiency may not be achieved.

Figure 6:
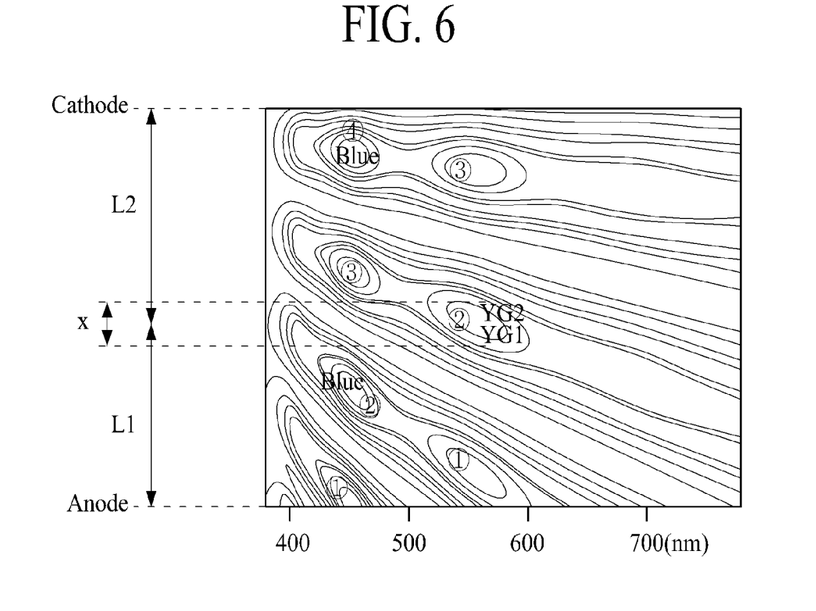
FIG. 6 is a diagram illustrating positions of peak wavelengths in the organic light emitting diode by wavelengths of blue light and yellow-green (YG) light.

FIG. 6 is a diagram illustrating a peak wavelength position in the organic light emitting diode for each wavelength of blue (B) light and yellow-green (YG) light.

In FIG. 6, the horizontal axis represents the wavelength (nm) of light and the vertical axis represents the position in the thickness direction of the organic light-emitting device.

As illustrated in FIG. 6, the peak wavelength is present at a total of four positions (1), (2), 3), and (4) between the anode and the cathode in the blue wavelength band, that is, in a wavelength band between 440 nm and 480 nm. Here, position (1) overlaps the anode and it is thus difficult to form the blue light-emitting layer at that position. Position (3) may overlap the yellow-green (YG) light-emitting layer and it is thus difficult to form the blue light-emitting layer at that position. Therefore, it is preferable that the blue light-emitting layer be formed at position (2) and position (4). That is, it is preferable that the first light-emitting layer 230 emitting blue light in the first light-emitting portion 200 be located at position (2) and the third light-emitting layer 630 emitting blue light in the third light-emitting portion 600 be located at position (4).

In the yellow-green (YG) wavelength band, that is, in the wavelength band between 520 nm to 590 nm, the peak wavelength is present at a total of three positions (1), (2), and (3) between the anode and the cathode. Here, in consideration of the positions of the first light-emitting layer 230 and the third light-emitting layer 630 emitting blue light, it is preferable that the yellow-green (YG) light-emitting layer be formed at position (2). That is, it is preferable that the second light-emitting layer 430 of the second light-emitting portion 400 be located at position (2).

Here, position (2) at which the second light-emitting layer 430 of the second light-emitting portion 400 is located corresponds to the area marked by x between the anode and the cathode of the organic light emitting diode. The middle point of the area marked by x corresponds to the interface between the lower light-emitting layer 431 (YG1) and the upper light-emitting layer 432 (YG2) of the second light-emitting layer 430. Accordingly, the distance from the anode to the middle point of the area marked by x is the first distance L1 and the distance from the cathode to the middle point of the area marked by x is the second distance L2.

As an experiment result, the ratio L2/L1 of the second distance L2 to the first distance L1 ranges from 1.0 to 1.3.

The organic light emitting diode according to the invention can be applied to an illumination, may be used as a thin light source of a liquid crystal display apparatus, or may be applied to a display apparatus. An example in which the organic light emitting diode according to the invention is applied to a display apparatus will be described below.

Figure 7:
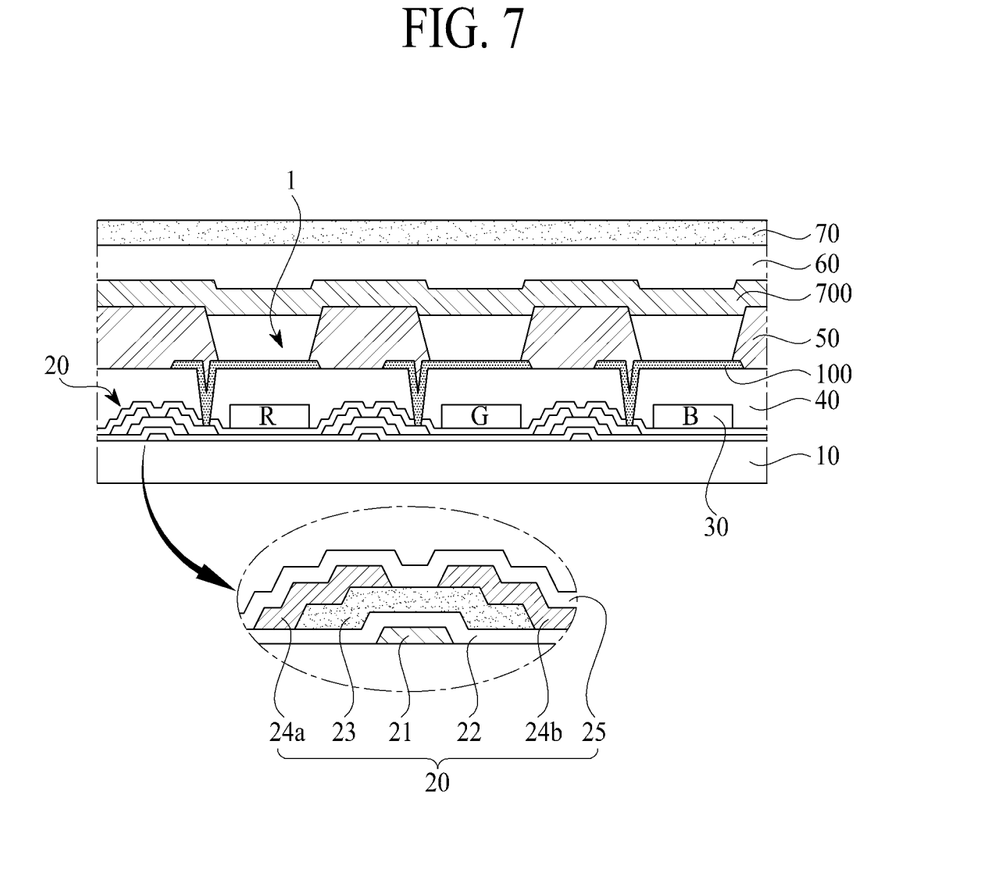
FIG. 7 is a schematic cross-sectional view of an organic light emitting display apparatus according to an embodiment of the present invention.

FIG. 7 is a schematic cross-sectional view of an organic light emitting display apparatus according to an embodiment of the invention, where the organic light emitting diode illustrated in FIG. 5 is used.

As illustrated in FIG. 7, the organic light emitting display apparatus according to an embodiment of the invention includes a substrate 10, a thin-film transistor layer 20, a color filter layer 30, a planarization layer 40, a bank layer 50, a first electrode 100, an organic layer 1, a second electrode 700, an encapsulation layer 60, and an encapsulation substrate 70.

The substrate 10 may be formed of glass or a flexible transparent plastic such as polyimide, but is not limited to these materials.

The thin-film transistor layer 20 is formed on the substrate 10. The thin-film transistor layer 20 includes a gate electrode 21, a gate insulating film 22, a semiconductor layer 23, a source electrode 24a, a drain electrode 24b, and a protective film 25.

The gate electrode 21 is formed in patterns on the substrate 10, the gate insulating film 22 is formed on the gate electrode 21, the semiconductor layer 23 is formed on the gate insulating film 22, the source electrode 24a and the drain electrode 2b are formed in patterns on the semiconductor layer 23 so as to face each other, and the protective film 25 is formed on the source electrode 24a and the drain electrode 24b.

In the drawing, a bottom gate structure in which the gate electrode 21 is formed under the semiconductor layer 23 is illustrated, but a top gate structure in which the gate electrode 21 is formed on the semiconductor layer 23 may be employed.

The color filter layer 30 is formed on the thin-film transistor layer 20. The color filter layer 30 includes a red (R) color filter, a green (G) color filter, and a blue (B) color filter which are formed in patterns for each pixel. The color filter layer 30 transmits light of a specific wavelength among white light emitted from the organic layer 1.

The planarization layer 40 is formed on the color filter layer 30 to planarize the surface of the substrate. The planarization layer 40 can be formed of an organic insulating film such as photoacryl, but is not limited to the material.

The bank layer 50 is formed on the planarization layer 40 to define pixel areas. That is, the bank layer 50 is formed in a matrix structure in boundary areas between plural pixels, whereby the pixel areas are defined by the bank layer 50.

The combination of the first electrode 100, the organic layer 1, and the second electrode 700 is the organic light emitting diode emitting reddish white light illustrated in FIG. 5.

The first electrode 100 is connected to the drain electrode 24b via contact holes formed in the protective film 25 and the planarization layer 40. The first electrode 100 is formed in patterns for each pixel.

The second electrode 700 is also formed on the bank layer 50 as well as the organic layer 1. This is because a common voltage is applied to the second electrode 700 and it is thus necessary to form the second electrode in patterns for each pixel.

The organic layer 1 includes the first light-emitting layer 200, the first charge generating layer 300, the second light-emitting layer 400, the second charge generating layer 500, and the third light-emitting portion 600 and detailed description thereof will not be repeated.

The organic layer 1 is divided by pixels in the drawing, but is not limited to this configuration. The organic layers 1 by pixels may be connected to each other. According to an embodiment of the invention, white light is emitted from the organic layer 1 and the emitted white light passes through the color filter layer 30 formed in patterns for each pixel to form a full color image. Accordingly, since the organic layer 1 emitting the white light is commonly applied to all the pixels, the organic layer 1 may not be divided by pixels.

The encapsulation layer 60 is formed on the second electrode 700. The encapsulation layer 60 functions to prevent moisture from permeating the organic layer 1. The encapsulation layer 60 may include multiple layers in which different inorganic materials are stacked or multiple layers in which an inorganic material and an organic material are alternately stacked.

The encapsulation substrate 70 is formed on the encapsulation layer 60. The encapsulation substrate 70 may be formed of glass or plastic or may be formed of metal. The encapsulation substrate 70 may be attached to the encapsulation layer 60 with an adhesive.

The organic light-emitting display apparatus illustrated in FIG. 7 employs a so-called bottom emission type in which light emitted from the organic layer 1 travels toward the substrate 10 on the downside, but the invention is not limited to this type. A so-called top emission type in which light emitted from the organic layer 1 travels toward the encapsulation substrate 70 on the upside may be employed. When the invention employs the top emission type, the color filter layer 30 may be formed on the bottom surface of the encapsulation substrate 70.

According to an embodiment of the present invention, the organic layer emits reddish white light. Accordingly, even when the X-axis color coordinate value and the Y-axis color coordinate value at each pixel position are not constant but fluctuate and reddish white light is emitted from a specific pixel position, reddish white light is already emitted from the screen as a whole and thus a user cannot recognize a color defect at the specific pixel position.

While the embodiments of the invention have been described above with reference to the accompanying drawings, the invention is not limited to the embodiments, but can be modified in various forms without departing from the technical spirit of the invention. Therefore, the above-mentioned embodiments of the invention are not provided for defining the technical spirit of the invention but for explaining the technical spirit thereof, and the scope of the invention is not limited to the embodiments. Accordingly, it should be understood that the above-mentioned embodiments are exemplary in all the points of view and are not restrictive. It should be construed that the scope of the invention is defined by only the appended claims and all technical concepts equivalent thereto are included in the scope of the invention.

What is claimed is:

1. An organic light emitting diode comprising:
a first electrode;
a second electrode; and
an organic layer between the first electrode and the second electrode to emit white light,
wherein the organic layer is configured to emit white light in which an X-axis coordinate value in a color coordinate system is equal to or greater than 0.29, a Y-axis coordinate value in the color coordinate system is in a range of 0.32 to 0.45, and the Y-axis coordinate value in the color coordinate system is equal to or greater than the X-axis coordinate value in the color coordinate system, wherein a range of fluctuation of the X-axis coordinate value at each pixel position and a range of fluctuation of the Y-axis coordinate value at each pixel position are equal to or less than 0.015.

2. The organic light emitting diode according to claim 1, wherein the organic layer is configured to emit white light in which the Y-axis coordinate value in the color coordinate system is greater by 0.03 or more than the X-axis coordinate value in the color coordinate system.

3. The organic light emitting diode according to claim 1, wherein the organic layer includes a first light-emitting portion on the first electrode to emit blue light, a second light-emitting portion on the first light-emitting portion to emit yellow-green light or mixed light of green and red, and a third light-emitting portion on the second light-emitting portion to emit blue light.

4. The organic light emitting diode according to claim 3, wherein the second light-emitting portion includes a lower light-emitting layer and an upper light-emitting layer and a first distance from the top surface of the first electrode to an interface between the lower light-emitting layer and the upper light-emitting layer is equal to or less than a second distance from the bottom surface of the second electrode to the interface between the lower light-emitting layer and the upper light-emitting layer.

5. The organic light emitting diode according to claim 4, wherein a ratio of the second distance to the first distance is in a range of 1.0 to 1.3.

6. The organic light emitting diode according to claim 4, wherein the lower light-emitting layer and the upper light-emitting layer are configured to emit yellow-green light and a concentration of a dopant with which the lower light-emitting layer is doped is greater than a concentration of a dopant with which the upper light-emitting layer is doped.

7. The organic light emitting diode according to claim 4, wherein the lower light-emitting layer is configured to emit red light and the upper light-emitting layer is configured to emit green light.

8. The organic light emitting diode according to claim 1, wherein the first electrode is a transflective electrode and the second electrode is a reflective electrode.

9. An organic light emitting display apparatus comprising:
a substrate;
a thin-film transistor layer on the substrate;
an organic light emitting diode on the thin-film transistor layer to emit white light;
an encapsulation layer on the organic light-emitting diode; and
a color filter layer transmitting light of a specific wavelength among the white light emitted from the organic light emitting diode,
wherein the organic light emitting diode includes a first electrode, a second electrode, and an organic layer between the first electrode and the second electrode to emit white light, and wherein the organic layer is configured to emit white light in which an X-axis coordinate value in a color coordinate system is equal to or greater than 0.29, a Y-axis coordinate value in the color coordinate system is in a range of 0.32 to 0.45, and the Y-axis coordinate value in the color coordinate system is equal to or greater than the X-axis coordinate value in the color coordinate system, wherein a range of fluctuation of the X-axis coordinate value at each pixel position and a range of fluctuation of the Y-axis coordinate value at each pixel position are equal to or less than 0.015.

10. The organic light emitting display apparatus according to claim 9, wherein the organic layer is configured to emit white light in which the Y-axis coordinate value in the color coordinate system is greater by 0.03 or more than the X-axis coordinate value in the color coordinate system.

11. The organic light emitting display apparatus according to claim 9, wherein the organic layer includes a first light-emitting portion on the first electrode to emit blue light, a second light-emitting portion on the first light-emitting portion to emit yellow-green light or mixed light of green and red, and a third light-emitting portion on the second light-emitting portion to emit blue light.

12. The organic light emitting display apparatus according to claim 11, wherein the second light-emitting portion includes a lower light-emitting layer and an upper light-emitting layer and a first distance from the top surface of the first electrode to an interface between the lower light-emitting layer and the upper light-emitting layer is equal to or less than a second distance from the bottom surface of the second electrode to the interface between the lower light-emitting layer and the upper light-emitting layer.

13. The organic light emitting display apparatus according to claim 12, wherein a ratio of the second distance to the first distance is in a range of 1.0 to 1.3.

14. An organic light emitting display apparatus comprising:
a first electrode;
a second electrode;
a first light-emitting portion on the first electrode, the first light-emitting portion including a first light-emitting layer;
a second light-emitting portion on the first light-emitting portion, the second light-emitting portion including a second light-emitting layer; and
a third light-emitting portion on the second light-emitting portion, the third light-emitting portion including a third light-emitting layer,
wherein the second light-emitting layer includes a first area and a second area, and a first distance from the top surface of the first electrode to the first area is equal to or less than a second distance from the bottom surface of the second electrode to the second area,
wherein the second light-emitting layer is configured to emit yellow-green light and a concentration of a dopant with which the first area is doped is greater than a concentration of a dopant with which the second area is doped so as to enhance red efficiency.

15. The organic light emitting display apparatus according to claim 14, wherein a ratio of the second distance to the first distance is in a range of 1.0 to 1.3.

16. The organic light emitting display apparatus according to claim 14, wherein white light in which an X-axis coordinate value in a color coordinate system is equal to or greater than 0.29, a Y-axis coordinate value in the color coordinate system is in a range of 0.32 to 0.45, and the Y-axis coordinate value in the color coordinate system is equal to or greater than the X-axis coordinate value in the color coordinate system is emitted so as to reduce a color defect of the organic light-emitting display apparatus.

17. The organic light emitting display apparatus according to claim 16, wherein a range of fluctuation of the X-axis coordinate value at each pixel position and a range of fluctuation of the Y-axis coordinate value at each pixel position are equal to or less than 0.015 so as to minimize a color coordinate difference of the white light at each pixel position of the organic light-emitting display apparatus.

\* \* \* \* \*